United States Patent
Curran et al.

(10) Patent No.: US 10,842,035 B1
(45) Date of Patent: Nov. 17, 2020

(54) NITRIDED TITANIUM SURFACES WITH A NATURAL TITANIUM COLOR

(71) Applicant: Apple Inc., Cupertino, CA (US)

(72) Inventors: James A. Curran, Sunnyvale, CA (US); Zechariah D. Feinberg, San Francisco, CA (US); Todd S. Mintz, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/562,164

(22) Filed: Sep. 5, 2019

(51) Int. Cl.
| | |
|---|---|
| *H05K 5/04* | (2006.01) |
| *C25D 11/26* | (2006.01) |
| *H01R 13/506* | (2006.01) |
| *H05K 5/00* | (2006.01) |
| *C23C 8/24* | (2006.01) |

(52) U.S. Cl.
CPC .............. *H05K 5/04* (2013.01); *C23C 8/24* (2013.01); *C25D 11/26* (2013.01); *H01R 13/506* (2013.01); *H05K 5/0004* (2013.01)

(58) Field of Classification Search
CPC ........ H05K 5/04; H05K 5/0004; C25D 11/26; H01R 13/506; C23C 8/24
See application file for complete search history.

(56) References Cited

U.S. PATENT DOCUMENTS

| | | | |
|---|---|---|---|
| 7,333,343 B2* | 2/2008 | Olzak | F16L 5/04 174/544 |
| 2011/0104404 A1 | 5/2011 | Hamamura | |
| 2012/0088558 A1* | 4/2012 | Song | H04M 1/18 455/575.1 |
| 2012/0115706 A1 | 5/2012 | Ohta | |
| 2013/0133787 A1 | 5/2013 | Kim et al. | |
| 2014/0204508 A1 | 7/2014 | Zhang | |

FOREIGN PATENT DOCUMENTS

EP    2298948 A1    3/2011

OTHER PUBLICATIONS

Ouchi, C., H. Iizumi, and S. Mitao. "Effects of ultra-high purification and addition of interstitial elements on properties of pure titanium and titanium alloy." Materials Science and Engineering: a 243.1-2 (1998): 186-195.*

* cited by examiner

*Primary Examiner* — Jessee R Roe
(74) *Attorney, Agent, or Firm* — Dorsey & Whitney LLP

(57) ABSTRACT

This application relates to an enclosure for a portable electronic device. The enclosure includes a titanium substrate having interstitial nitrogen atoms, where the titanium substrate is characterized as having an a* value that is less than 1, a b* value that is less than 5, and an L* value that is more than 70.

14 Claims, 11 Drawing Sheets

NITRIDED TITANIUM SURFACES WITH A NATURAL TITANIUM COLOR

FIELD

The described embodiments relate generally to a titanium part having an external surface hardened by nitriding. More particularly, the described embodiments relate to a method for forming a nitrided titanium part having a natural titanium color.

BACKGROUND

Enclosures for portable electronic devices may be formed from a variety of different materials. In certain instances, the enclosure may be formed from titanium. However, in the consumer electronics space, where there is a greater demand for wear resistance, titanium and its alloys thereof may be insufficient to provide sufficient hardness and strength to protect operational components carried by these enclosures. Although titanium and its alloy thereof are capable of undergoing a "case-hardening" process, the resulting titanium nitride is characterized as having a distinctive gold/brown color that many consumers find unattractive.

SUMMARY

This paper describes various embodiments that relate generally to a titanium part having an external surface hardened by nitriding. More particularly, the described embodiments relate to a method for forming a nitrided titanium part having a natural titanium color.

According to some embodiments, an enclosure for a portable electronic device is described. The enclosure includes a titanium substrate having interstitial nitrogen atoms, where the titanium substrate has a color characterized as having an a* value that is less than 1 and a b* value that is less than 5.

According to some embodiments, an enclosure for a portable electronic device is described. The enclosure includes a titanium substrate and a titanium nitride layer that overlays the titanium substrate, where the titanium nitride layer has a thickness less than 100 micrometers, and the titanium nitride layer has a color characterized as having an a* value less than 1 and a b* value less than 5.

According to some embodiments, a method for forming an enclosure for a portable electronic device, the enclosure including a nitrided titanium substrate, is described. The method includes forming an anodized nitrided part from the nitrided titanium substrate, wherein the anodized nitrided part includes an anodized layer overlaying the nitrided titanium substrate, and forming a nitrided part by removing the anodized layer of the anodized nitrided part, wherein the nitrided part has an a* value that is less than 1 and a b* value that is less than 5.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
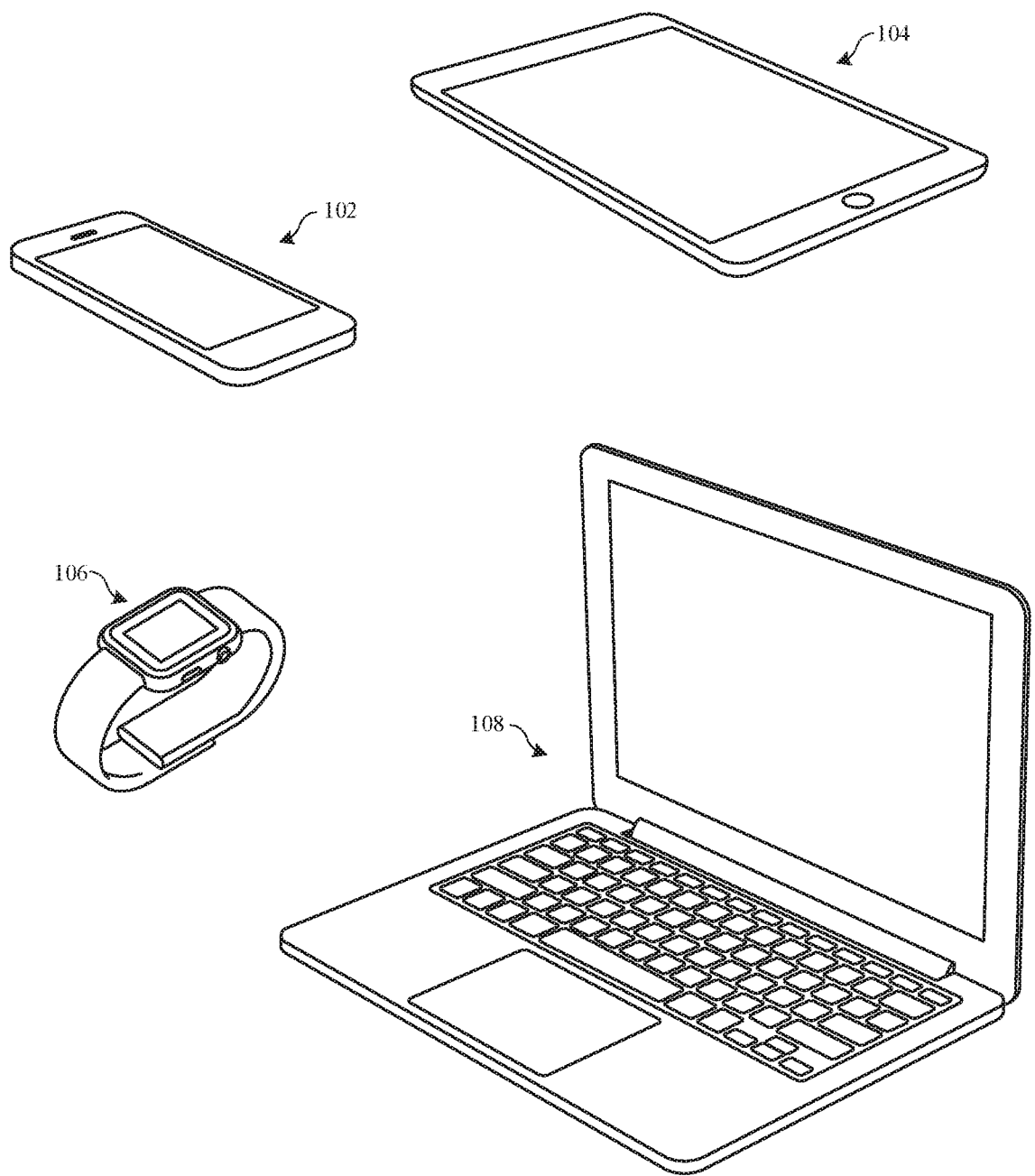
FIG. 1 illustrates perspective views of various portable electronic devices having enclosures that may be processed using the techniques described herein, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Enclosures for portable electronic devices may be formed from a variety of different materials. In certain instances, the enclosure may be formed from titanium, which is attractive over stainless steel and aluminum due to titanium's high strength-to-weight ratio. Additionally, titanium is highly corrosion-resistant. However, in the consumer electronics space, where there is a greater demand for wear resistance, titanium and its alloys thereof may be insufficient to provide sufficient hardness and strength to protect operational components carried by these enclosures. Although titanium and its alloy thereof may undergo a "case-hardening" process via exposure to a nitriding process, the resulting titanium nitride is characterized as having a distinctive gold/brown color that many consumers find unattractive. Yet, the increased hardness of titanium and its alloys thereof imparted by the nitriding process is very desirable for manufacturers in the consumer electronics space.

Accordingly, the embodiments described herein set forth techniques for forming a nitrided titanium part, and subsequently restoring the color of the nitrided titanium part from its gold or brown color to a natural titanium color. In particular, the techniques involve nitriding a titanium or titanium alloy substrate in a controlled nitriding process. The controlled nitriding process includes controlling parameters that include the temperature, duration, and/or the atmospheric pressure. Controlling these parameters can be used to reduce the amount of effort, time, and expense that is required for subsequent steps for forming the nitrided titanium part having the natural titanium color.

Subsequent to the nitriding process, the titanium nitride layer of the nitrided titanium substrate that is responsible for the gold/brown color is chemically stripped away by subjecting the nitrided titanium substrate to a succession of anodization and chemical etching processes. Notably, the titanium nitride layer cannot be chemically stripped away absent the anodization process. Although the titanium nitride layer has been stripped away, the remaining portion of the nitrided titanium substrate still exhibits elevated hardness (e.g., >850 Hv) due to diffusion of nitrogen atoms that penetrated deep into the metal matrix of the titanium or titanium alloy substrate.

Notably, it is surprising and unexpected that the titanium nitride layer has such a shallow thickness, and that the gold/brown color can be removed by etching less than 1 μm of the nitrided titanium material from the external surface of the nitrided titanium substrate.

As used herein, the terms anodic film, anodized film, anodic layer, anodized layer, anodic oxide coating, anodic layer, anodic oxidized layer, metal oxide layer, oxide film, oxidized layer, and oxide layer can be used interchangeably where appropriate. In one example, an anodized layer can result from an electrochemical anodization process of titanium or a titanium alloy. In another example, metal oxide layers can result from a non-electrolytic oxidation process. It should be noted that the processes for forming an anodized layer and a metal oxide layer may be different. As used herein, the terms segment, region, and section can also be used interchangeably where appropriate.

In some examples, the color of the nitrided titanium part may be characterized according to CIE L*a*b* color-opponent dimension values. The L* color opponent dimension value is one variable in an L*a*b* color space. In general, L* corresponds to an amount of lightness. L*=0 represents the darkest black while L*=100 represents white in general, a* indicates amounts of red color and green color in a sample. A negative a* value indicates a green color, while a positive a* value indicates a red color. Accordingly, samples having a positive a* value will indicate that more red than green is present. In general, b* indicates amounts of blue color and yellow color in a sample. A negative b* value indicates a blue color, while a positive b* value indicates yellow color. Accordingly, samples having a positive b* value will indicate more yellow than blue is present.

According to some embodiments, a non-nitrided titanium substrate or titanium alloy substrate may have natural titanium color, which is defined as an L*a*b color space value of an L* value greater than 70, an a* value less than 1, and a b* value less than 5. As described herein, the modified nitrided part may have a color that is within ~1 ΔE94 of the natural titanium color.

According to some embodiments, an enclosure for a portable electronic device is described. The enclosure includes a titanium substrate having interstitial nitrogen atoms, where the titanium substrate has a color characterized as having an a* value that is less than 1 and a b* value that is less than 5.

These and other embodiments are discussed below with reference to FIGS. 1-8; however, those skilled in the art will readily appreciate that the detailed description given herein with respect to these figures is for explanatory purposes only and should not be construed as limiting.

FIG. 1 illustrates various portable electronic devices that can be processed using the techniques as described herein. The techniques as described herein can be used to process surfaces of enclosures of the portable electronic devices. In some examples, the enclosures can include at least one of a metal, a metal alloy, a polymer, glass, ceramics, or a thermoplastic. In particular, metallic enclosures can include titanium or a titanium alloy (e.g., Ti6Al4V).

FIG. 1 illustrates exemplary portable electronic devices including a smartphone 102, a tablet computer 104, a smartwatch 106, and a portable computer 108 that include enclosures that may be processed using the techniques as described herein. These exemplary portable electronic devices may be capable of using personally identifiable information that is associated with one or more users. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

Surface(s) of the portable electronic devices 102, 104, 106, 108 described herein may assume any number of desired surface geometries and surface finishes. In some examples, the enclosures may have a three-dimensional structure having a height, width, and depth, and any type of geometry. In particular, the enclosure is characterized as rectangular, polygonal, circular, beveled edges, angular edges, elliptical, etc.

FIGS. 2A-2D illustrate cross-sectional views of a process for forming a nitrided titanium part having a natural titanium color, in accordance with some embodiments. In some embodiments, a metal part 200, that is processed according to the techniques described herein, has a near net shape of a final part, such as the enclosures of the portable electronic devices 102, 104, 106, and 108.

Figure 2A:
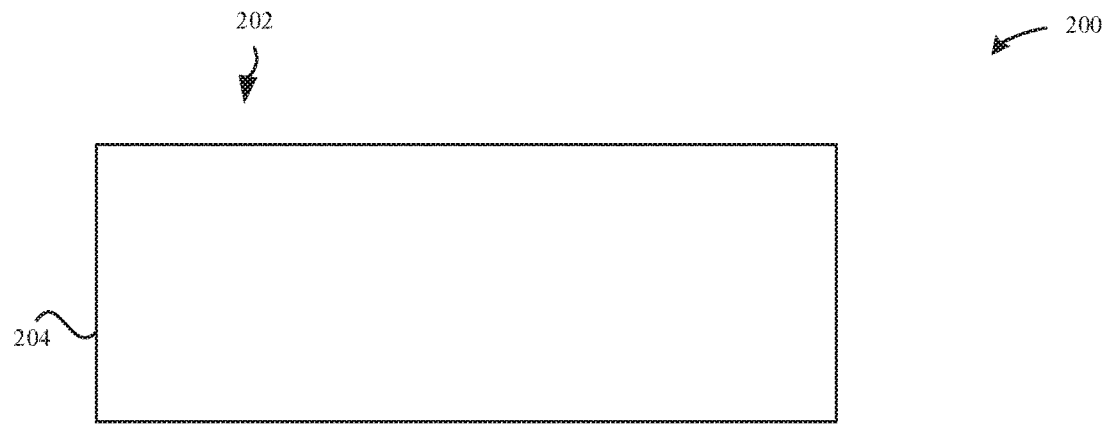
FIGS. 2A-2E illustrate cross-sectional views of a process for forming a nitrided titanium part, in accordance with some embodiments.

FIG. 2A illustrates a cross-sectional view of a metal part 200 prior to undergoing a process for forming a doped metal oxide coating. In some examples, the metal part 200 includes a metal substrate 204, where the metal substrate 204 is formed of titanium or a titanium alloy (e.g., Ti6Al4V). In some examples, Ti6Al4V has a Vickers hardness of 320 $Hv_{0.1}$. Notably, the hardness of the metal substrate 204 may be insufficient to provide sufficient hardness and strength for protecting operational components that are carried by the respective enclosures of the portable electronic devices 102, 104, 106, and 108. However, the metal substrate 204 may have a natural titanium color that consumers may consider attractive.

Figure 2B:
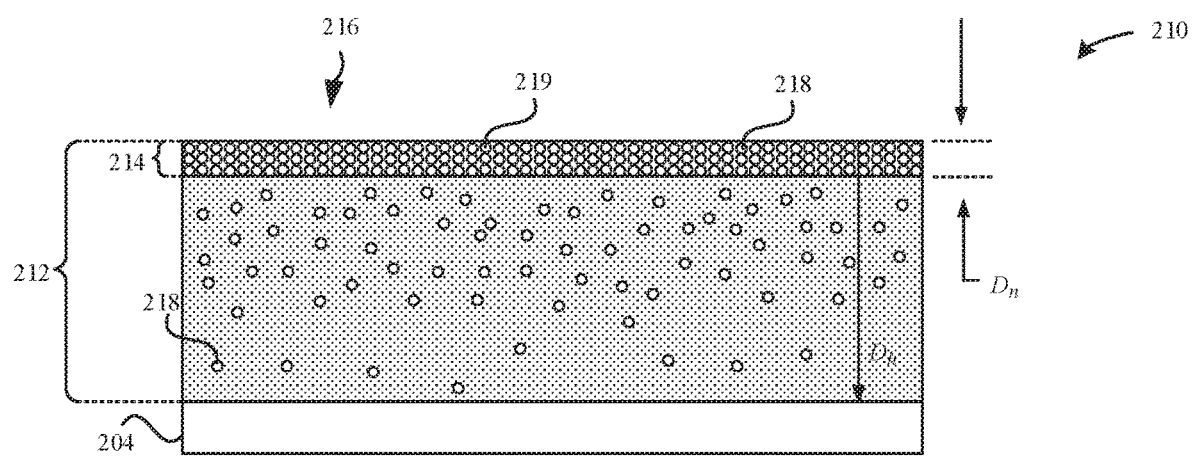

FIG. 2B illustrates a cross-sectional view of a nitrided titanium substrate 210 subsequent to a nitriding process, in accordance with some embodiments. During the nitriding process, the metal part 200 may be exposed to a heat treating process that involves exposing the metal substrate 204 to a nitrogen-rich atmosphere at a temperature between 850° C. to 1100° C. The metal substrate 204 is annealed in the nitrogen-rich atmosphere having a partial pressure of N2 of ~625 Torr (0.82 atm). In some embodiments, the nitriding process is a controlled process.

The nitriding process causes nitrogen atoms to diffuse into the metal substrate 204. As a result of the nitriding process, the nitrided titanium substrate 210 includes a titanium nitride layer 214. The titanium nitride layer 214 is a thin, ceramic coating (e.g., ~less than 1 μm) that provides a hardened protective coating or "case hardening." However, the titanium nitride layer 214 has a distinctive gold/brown color due to a significant amount of nitrogen atoms that diffuse into the metal substrate 204. Notably, consumers may consider this distinctive gold/brown color to be aesthetically unattractive. In some examples, this gold/brown color is characterized as having an a* value greater than 1 and a b* value greater than 5. In some examples, interstitial nitrogen atoms 218 penetrate beyond the external surface 216 of the nitrided titanium substrate 210 up to a depth ($D_n$) of several 10 s of μms. The titanium nitride layer 214 is characterized as having a thickness of less than 1 μm due to the interstitial nitrogen atoms 218 penetrating to a depth ($D_n$) from the external surface 216.

As illustrated in FIG. 2B, the nitrided titanium substrate 210 includes the titanium nitride layer 214 that overlays the hardened titanium region 212 and the metal substrate 204. The titanium nitride layer 214 includes nitride compounds 219 that form within the metal matrix of the metal substrate 204. In some embodiments, the titanium nitride layer 214 includes an amount of the nitride compounds 219 that is sufficient to impart the titanium nitride layer 214 with a gold/brown color.

Relative to the hardened titanium region 212, the titanium nitride layer 214 has an elevated concentration of the interstitial nitrogen atoms 218 that causes the titanium nitride layer 214 to have a gold/brown color. Indeed, there is a corresponding relationship between hardness and concentration of the interstitial nitrogen atoms 218. The interstitial nitrogen atoms 218 diffuse into the metal substrate 204 such as to form a hardened titanium region 212. As defined herein, the term "interstitial" refers to the interstitial nitrogen atoms 218 occupying interstitial sites of the titanium matrix of the metal substrate 204. It should be noted that the interstitial nitrogen atoms 218 may not completely penetrate the entire thickness of the metal substrate 204. Thus, some interstitial sites of the titanium matrix are not occupied by the nitrogen atoms.

As illustrated in FIG. 2B, the interstitial nitrogen atoms 218 penetrate the external surface 216 to a depth of several 10 s of μms. This region of the nitrided titanium substrate 210 having the interstitial nitrogen atoms 218 is referred to as the hardened titanium region 212. The volume of the titanium matrix that is occupied by the interstitial nitrogen atoms 218 as a result of the nitriding process is significantly greater than the extent of protection provided by the thin layer of a pure titanium nitride. In contrast to the metal substrate 204, the nitrided titanium substrate 210 has a Vickers hardness of about 925 $Hv_{0.1}$. In some examples, the increased hardness of the nitrided titanium substrate 210 may be attributed to the hardness of the titanium nitride layer 214, where the titanium nitride layer 214 has a Vickers hardness between about 1800 $Hv_{0.1}$ to 2100 $Hv_{0.1}$.

Although the nitrided titanium substrate 210 has an ideal hardness value that is suitable for protecting operational components for use with portable electronic devices 102, 104, 106, and 108, the color of the titanium nitride layer 214 may be considered unattractive. However, it is nearly impossible to chemically strip the titanium nitride layer 214 from the remaining portion (e.g., hardened titanium region 212). For example, exposing the nitrided titanium substrate 210 to an acid etching process without an intermediate anodizing step would have no effect as the gold/brown color would remain even after prolonged exposure to the chemical stripping process. Accordingly, the gold/brown color of the nitrided titanium substrate 210 is preferably corrected using an intermediate anodizing process as described herein. Notably, the remaining portion of the hardened titanium region 212 does not include a sufficient amount of interstitial nitrogen atoms 218 to cause the gold/brown color.

Figure 2C:
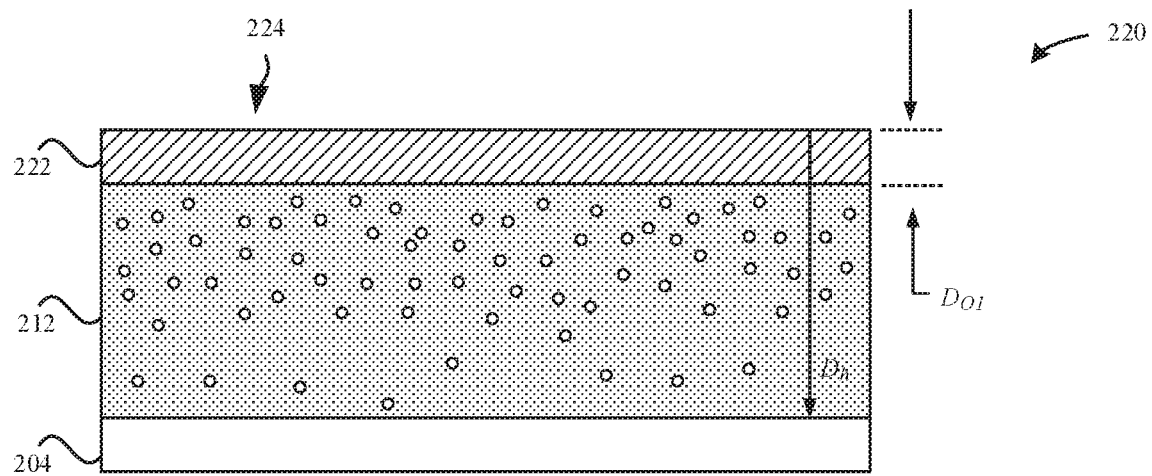

FIG. 2C illustrates a cross-sectional view of an oxidized nitride substrate 220 subsequent to an anodizing process, in accordance with some embodiments. During the anodizing process, the nitrided titanium substrate 210 is exposed to an electrolytic anodizing solution that includes sulfuric acid ($H_2SO_4$). In some examples, the anodizing process involves exposing the nitrided titanium substrate 210 an anodizing voltage between about 40 V-60 V for a duration of between 45 seconds-90 seconds. The anodizing process described herein involves penetrates the entire thickness of the nitrided titanium substrate 210. Accordingly, the anodizing process involves anodizing the nitrided titanium material of the nitrided titanium substrate 210 to form a metal oxide layer 222. In some embodiments, the metal oxide layer 222 may also be referred to as an anodized layer.

As illustrated in FIG. 2C, subsequent to the anodizing process, the oxidized nitride substrate 220 includes the metal oxide layer 222. The metal oxide layer 222 may include $TiO_x$ or $TiO_2$. The metal oxide layer 222 may have a thickness ($D_{O1}$) of about 100 nm. In contrast to the titanium nitride layer 214, the metal oxide layer 222 is colorless. According to some embodiments, the nitrided titanium substrate 210 may be anodized to various thicknesses, as described with reference to application Ser. No. 16/182,473, entitled "DURABLE COSMETIC FINISHES FOR TITANIUM SURFACES," which is incorporated herein by reference in its entirety for all purposes.

FIG. 2C illustrates that the oxidized nitride substrate 220 still includes the hardened titanium region 212. The hardened titanium region 212 corresponds to the interstitial nitrogen atoms 218 penetrating to a depth ($D_h$) of several 10 s of μms from an external surface 224 of the oxidized nitride substrate 220. The oxidized nitride substrate 220 may be characterized as having a hardness of 900 $Hv_{0.1}$. In other words, the anodizing process does not sacrifice the hardness of the oxidized nitride substrate 220.

Figure 2D:
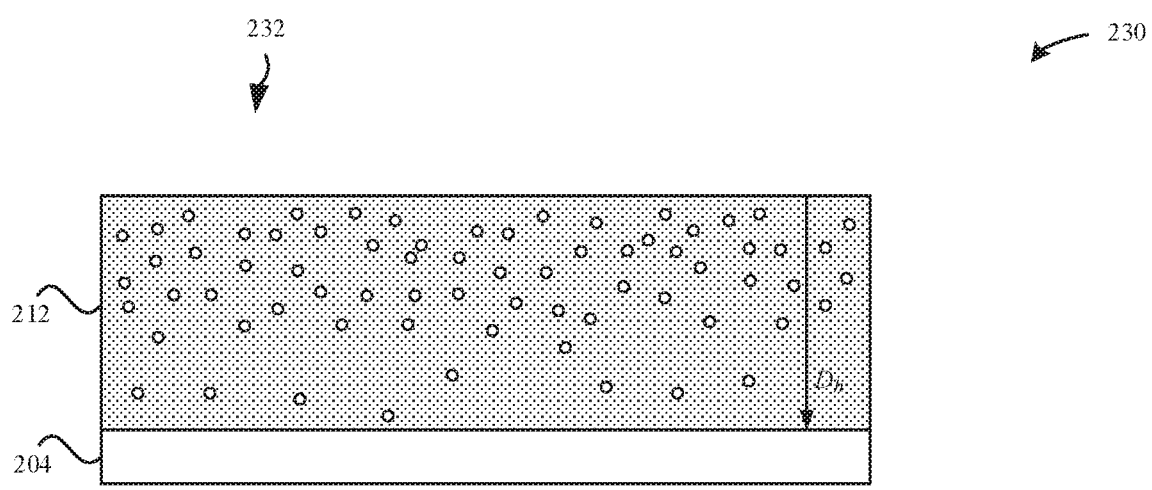

FIG. 2D illustrates a cross-sectional view of a modified nitrided part 230 subsequent to a chemical stripping process, in accordance with some embodiments. Notably, whereas prior to the anodizing process, the titanium nitride layer 214 could not be chemically stripped from the remaining portion (e.g., hardened titanium region 212), the chemical solution can be used to strip the metal oxide layer 222 from the remaining portion. According to some examples, the chemical stripping process involves exposing the oxidized nitride substrate 220 to a concentrated phosphoric acid solution ($H_3PO_4$) at a temperature (e.g., 85° C.) sufficient to etch the metal oxide layer 222.

FIG. 2D illustrates that the metal oxide layer 222 has been chemically stripped off such as to reveal the natural titanium color while maintaining the hardness conferred by the nitriding process. In particular, the modified nitrided part 230 may include an elevated concentration of nitrogen (e.g., >10 at %).

For example, the modified nitrided part 230 has a Vickers hardness of 850 $Hv_{0.1}$ or greater and a natural titanium color defined as an L* value greater than 70, an a* value less than 1, and a b* value less than 5. In some embodiments, only the absolute minimum amount of the titanium nitride layer 214 is removed such as to correct the color. Accordingly, in some examples, a majority of and/or an entirety of the titanium nitride layer 214 is removed. In some embodiments, the chemical stripping process restores the color of the modified nitrided part 230 to within ~1 ΔE94 of the color of the metal part 200.

FIG. 2D illustrates that the modified nitrided part 230 still includes the hardened titanium region 212. In some examples, the hardened titanium region 212 is referred to as a layer that overlays a non-nitrided region of the metal substrate 204. The hardened titanium region 212 corresponds to the interstitial nitrogen atoms 218 penetrating to a depth ($D_h$) of several 10 s of μms from an external surface 232 of the modified nitrided part 230. The chemical stripping process removes approximately less than 1 μm of an upper region of the hardened titanium region 212 (e.g., the titanium nitride layer 214). In some examples, the hardened titanium region 212 has a thickness less than 100 μm. In some examples, the hardened titanium region 212 has a thickness less than 50 μm. In some examples, the hardened titanium region 212 has a thickness less than 20 μm. In some examples, the thickness of the hardened titanium region 212 does not exceed an amount that causes the hardened titanium region 212 to have an a* value greater than 1 and a b* value greater than 5.

Figure 2E:
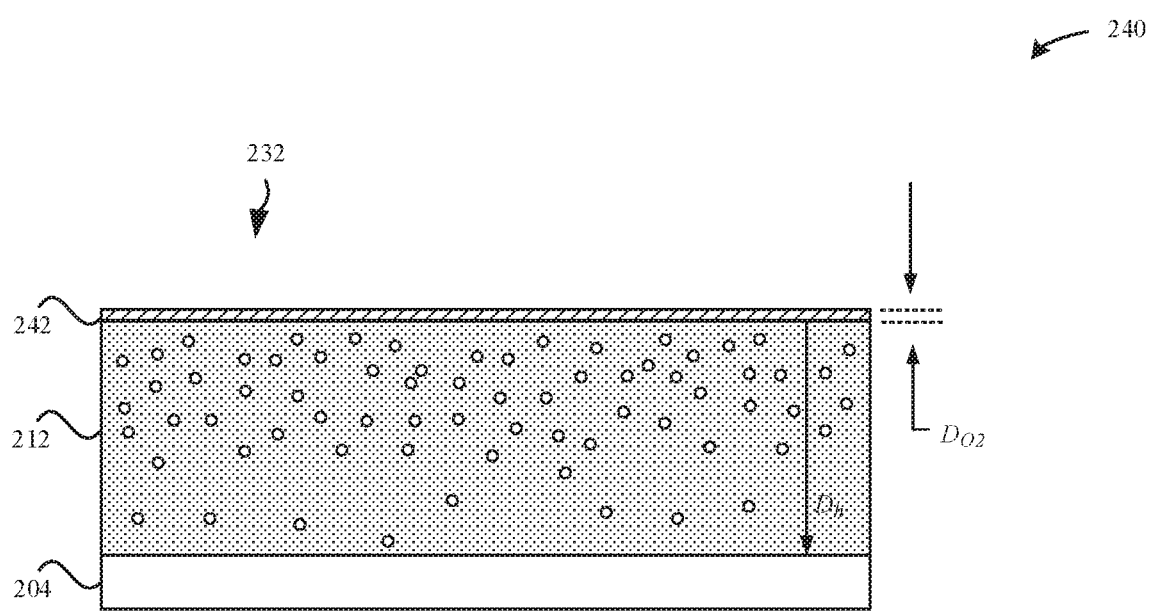

Alternatively, FIG. 2E illustrates a cross-sectional view of a modified nitrided oxidized part 240, in accordance with some embodiments. In particular, the modified nitrided oxidized part 240 may exhibit a range of colors based upon a thin film interference effect. For example, only a portion of the metal oxide layer 222 is chemically stripped from the oxidized nitrided substrate 220. As a result, the modified nitrided oxidized part 240 may still include a thin layer of the modified metal oxide layer 242; thereby, exhibiting a color based on the thin film interference effect. In some examples, the modified metal oxide layer 242 is less than 100 nm in thickness. In some embodiments, the modified metal oxide layer 242 of the modified nitrided oxidized part 240 may have a thickness $D_{O2}$ where $(D_{O2})<(D_{O1})$.

The thin film interference effect is dependent upon a refractive index of the modified metal oxide layer 242. In particular, the color of the anodized layer is a function of the thickness of the modified metal oxide layer 242. As noted above, only an amount of the modified metal oxide layer 242 is removed as is necessary to correct for the gold/brown color. In some instances, it may be desirable for the modified nitrided part 230 to exhibit a color via the thin film interference effect. It should be noted that any one of the techniques described herein for forming the modified nitrided part 230 may also be directed towards forming the modified nitrided oxidized part 240.

As described herein, the nitriding process for converting the metal part 200 to the modified nitrided part 230 and/or the modified nitrided oxidized part 240 involves a controlled process, such as carefully controlling the appropriate nitriding temperature. The controlled nitriding process described herein involves exposing the metal substrate 204 to the nitrogen gas and increasing the temperature to a target temperature between 850° C. to 1100° C. Establishing the appropriate target temperature is critical for achieving the appropriate hardness depth profile and/or color profile for the modified nitrided part 230. In particular, the nitriding process involves tailoring the color profile and/or the hardness profile of the modified nitrided part 230 and the modified nitrided oxidized part 240. For example, if the hardness profile of the nitrided titanium substrate 210 is very shallow, then subsequent to performing the anodizing process, then the hardness profile of the modified nitrided part 230 will be very shallow and may be unsuitable for sufficiently protecting the portable electronic devices 102, 104, 106, and 108. Additionally, if the gold/brown color profile of the nitrided titanium substrate 210 is too deep, then it may be very difficult to correct for this color. In other words, correctly tailoring the color profile and/or the hardness profile reduces the amount of expense, effort, and time required during the anodizing and chemical stripping processes.

Figure 3:
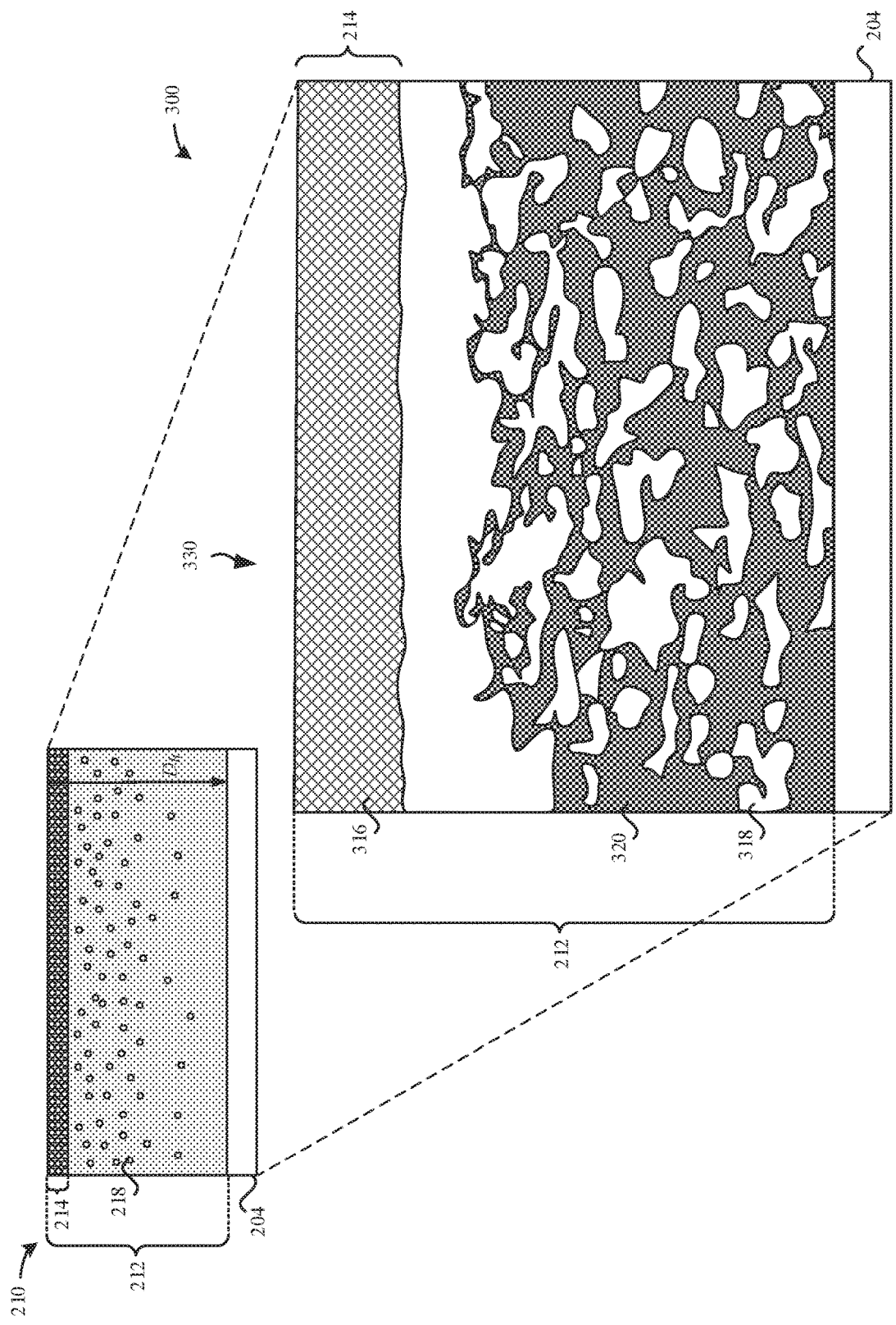
FIG. 3 illustrates a magnified cross-sectional view of a nitrided titanium substrate, in accordance with some embodiments.

FIG. 3 illustrates a magnified cross-sectional view of the nitrided titanium substrate 210, in accordance with some embodiments. As illustrated in FIG. 3, the nitrided titanium substrate 300 includes a hardened titanium region 212 that encompasses a titanium nitride layer 214. The hardened titanium region 212 overlays the metal substrate 204. During the nitriding process, nitrogen atoms react with the metal matrix 320 of the metal substrate 204, thereby causing nitride compounds 318 (e.g., TiN) to form within the metal matrix 320 of the metal substrate 204. The titanium nitride layer 214 includes an elevated concentration of the nitride compounds 318 relative to the remaining portion of the hardened titanium region 212. As a result, the titanium nitride layer 214 is characterized as having a gold/brown color. In some embodiments, the titanium nitride layer 214 includes a TiN compound material 316 that forms along an upper region (e.g., depth <1 μm) of the nitrided titanium substrate 300. In some embodiments, the TiN compound material 316 includes a dense amount of the nitride compounds 318 such as to impart the gold/brown color.

As illustrated in FIG. 3, the nitrogen atoms diffuse into the metal matrix 320, where a concentration of the nitrogen atoms 218 within the metal matrix 320 decreases as the depth from the external surface 330 increases. Accordingly, there is a greater concentration of nitrogen atoms 318 along the upper region (e.g., thickness >50 μm) than the lower region of the nitrided titanium substrate 300.

Figure 4:
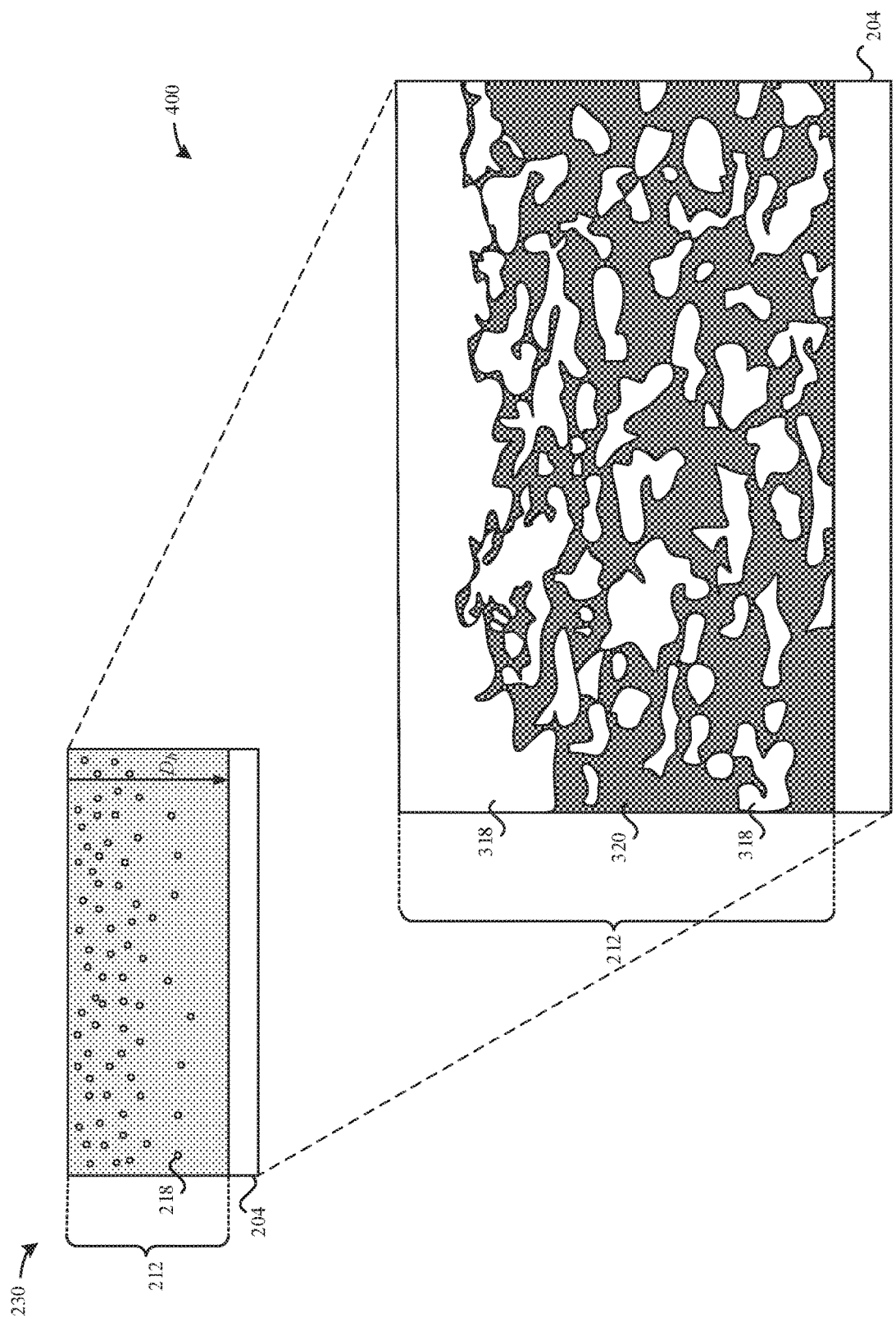
FIG. 4 illustrates a magnified cross-sectional view of a nitrided titanium part, in accordance with some embodiments.

FIG. 4 illustrates a magnified cross-sectional view of the modified nitrided part 230, in accordance with some embodiments. As described herein, the modified nitrided part 400 does not include the titanium nitride layer 214 nor the metal oxide layer 222. As a result, the modified nitrided part 400 has a reduced amount of interstitial nitrogen atoms 218 relative to the nitrided titanium substrate 300. Nevertheless, the modified nitrided part 400 has an elevated concentration of interstitial nitrogen atoms 218 (e.g., >10 at %), which is more than sufficient to impart the modified nitrided part 400 with a Vickers hardness of at least 850 $Hv_{0.1}$ or greater. In some embodiments, the modified nitrided part 400 has a Vickers hardness of greater than 800 $Hv_{0.1}$.

Figure 5A:
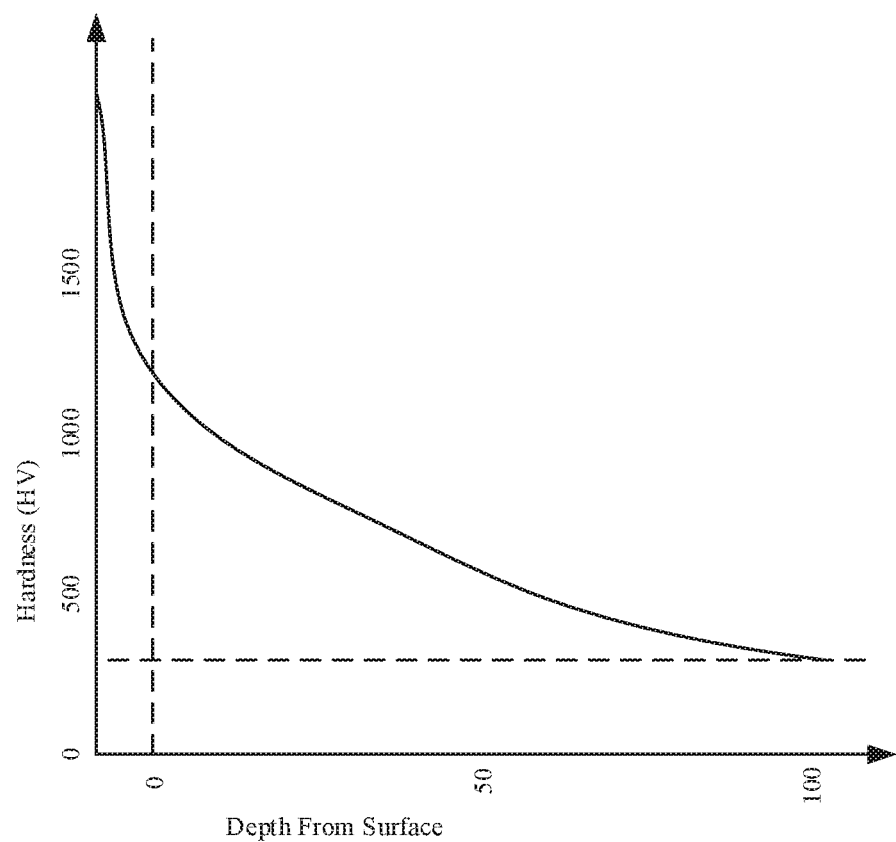
FIG. 5A illustrates an exemplary graph depicting hardness as a function of depth for a nitrided titanium substrate, in accordance with some embodiments.
Figure 5A:
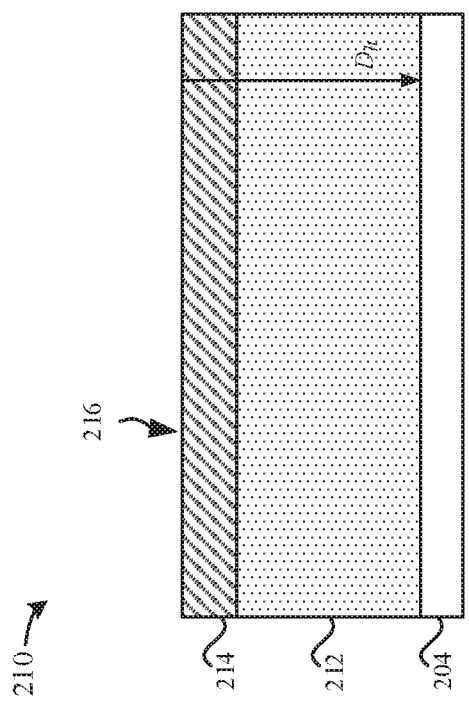
Figure 5B:
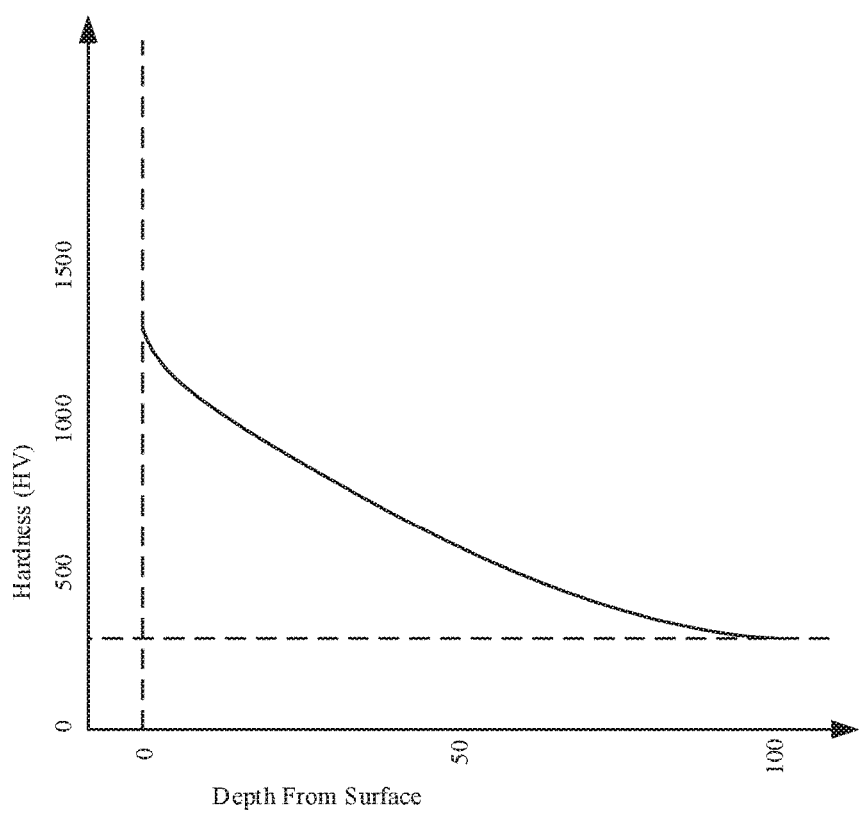
FIG. 5B illustrates an exemplary graph depicting hardness as a function of depth for a nitrided titanium part, in accordance with some embodiments.
Figure 5B:
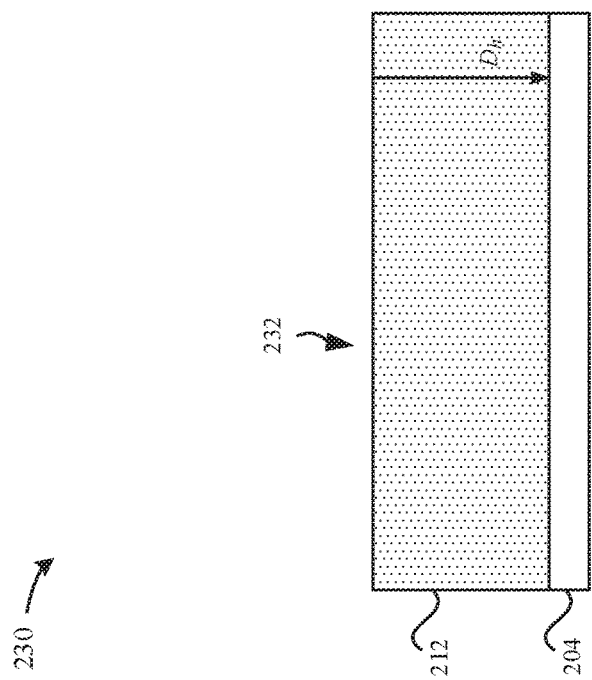

FIGS. 5A-5B illustrate exemplary hardness depth profiles of the nitrided titanium substrate 210 and the modified nitrided part 230, respectively. FIG. 5A illustrates an exemplary hardness depth profile as a function of depth from the external surface 216 of the nitrided titanium substrate 210. According to some examples, the nitrided titanium substrate 210 has a thickness of about 100 μm. As described herein, the nitrided titanium substrate 210 has a titanium nitride layer 214 that extends up to 1 μm from the external surface 216. The titanium nitride layer 214 has the greatest concentration of the interstitial nitrogen atoms 218, thereby imparting the titanium nitride layer 214 with the gold/brown color.

As depicted by the hardness depth profile, at a depth of less than 1 μm from the external surface 216, the nitrided titanium substrate 210 has a hardness greater than 1000 $Hv_{0.1}$. As depicted by the hardness depth profile, at a depth of 1 μm from the external surface 216, the nitrided titanium substrate 210 has a hardness of about 1000 $Hv_{0.1}$. As depicted by the hardness depth profile, at a depth of 50 μm from the external surface 216, the nitrided titanium substrate 210 has a hardness of about 500 $Hv_{0.1}$.

FIG. 5B illustrates an exemplary hardness depth profile as a function of depth from the external surface 232 of the modified nitrided part 230. According to some examples, the modified nitrided part 230 has a thickness of about 100 μm. The modified nitride part 230 is formed by anodizing the nitrided titanium substrate 210, and then subsequently stripping the metal oxide layer 222 from the oxidized nitrided substrate 220. The anodizing and stripping process removes less than 1 μm of the nitrided titanium matrix material from the oxidized nitrided substrate 220. According to some examples, the nitrided titanium matrix material that is removed corresponds to the titanium nitride layer 214. As a result, the modified nitride part 230 has a natural titanium color.

As depicted by the hardness depth profile, at a depth of 1 μm from the external surface 232 which may correspond to the thickness of the titanium nitride layer 214 that was removed, the modified nitride part 230 has a hardness of about 850 $Hv_{0.1}$ or greater. As depicted by the hardness depth profile, "case hardening" of the modified nitrided part 230 extends up to a depth of 100 μm from the external surface 232.

Figure 6:
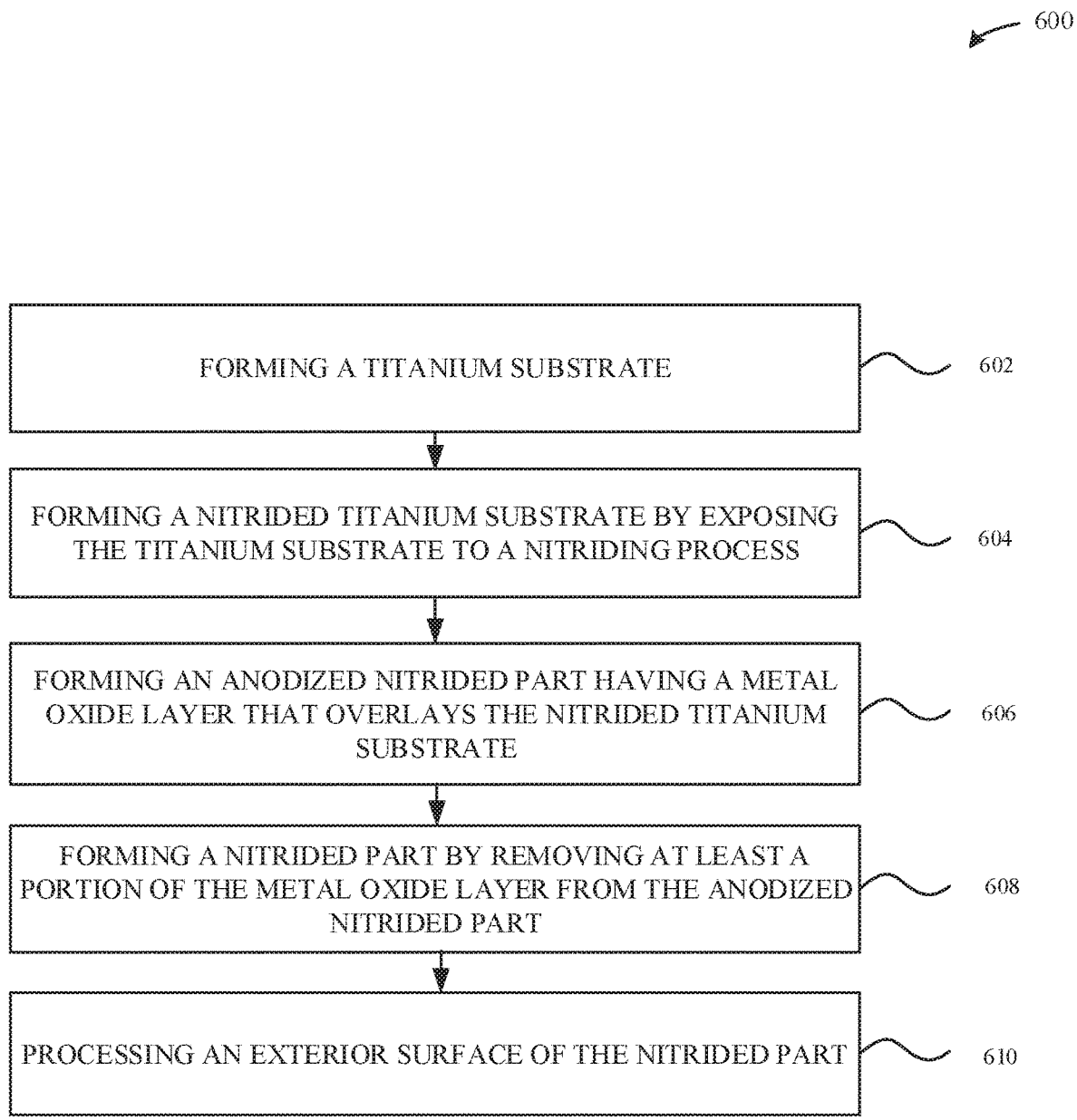
FIG. 6 illustrates a method for forming a nitrided titanium part, in accordance with some embodiments.

FIG. 6 illustrates a method 600 for forming nitrided titanium part, in accordance with some embodiments. In some embodiments, the method 800 may be implemented in conjunction with a closed feedback loop that is implemented by an optical detection system and/or a controlled electrolytic anodization system.

As illustrated in FIG. 6, the method 600 begins at step 602, which involves forming a metal substrate—e.g., the metal substrate 202. The metal substrate includes titanium or a titanium alloy. In some examples, the metal substrate has a Vickers hardness of about 320 $Hv_{0.1}$, which may be insufficient to protecting operational components carried by the portable electronic devices 102, 104, 106, and 108. Notably, the metal substrate is described as having a natural titanium color, which is defined as an L*a*b color space value of an L* value greater than 65 together with an a* value less than 1 and a b* value less than 5.

At step 604, the metal substrate 204 is exposed to a nitriding process. The nitriding process includes heating the metal substrate 204 in a nitrogen-rich atmosphere at a temperature between 850° C. to 1100° C. In some embodiments, the nitriding process is a controlled process in order to carefully monitor and control the hardness profile and color profile of the resulting nitrided titanium substrate 210.

Subsequent to the nitriding process, nitrogen atoms diffuse into the metal substrate 204 to form a hardened titanium region 212, which also encompasses the titanium nitride layer 214. While the titanium nitride layer 214 provides an elevated amount of hardness and strength, the titanium nitride layer 214 imparts the nitrided titanium substrate 210 with an unattractive gold/brown color.

At step 606, the nitrided titanium substrate 210 is exposed to an anodizing process to form the oxidized nitrided substrate 220. Notably, the titanium nitride layer 214 cannot be chemically stripped from the remaining portion of the hardened titanium region 212, where the remaining portion does not include a sufficient amount of interstitial nitrogen atoms 218 to cause the gold/brown color. Accordingly, the entire thickness of the nitrided titanium substrate 210 may be anodized to form a metal oxide layer 222. In some examples, the metal oxide layer 222 has a thickness of about 100 nm. In some examples, the metal oxide layer 222 has a thickness less than 200 nm.

At step 608, at least a portion of the metal oxide layer 222 is removed from the oxidized nitrided substrate 220 as is necessary to revert the color of the modified nitride part 230 to a natural titanium color. In some examples, the portion may constitute a majority and/or an entirety of the metal oxide layer 222.

In some embodiments, an optical detection system may be utilized to monitor the color of the modified nitride part 230. In some embodiments, the optical detection system may determine whether the color of the modified nitride part 230 satisfies predetermined value and/or range. For example, the optical detection system may determine at least one of whether the L* value of the modified nitride part 230 satisfies a predetermined L* value, the a* value of the modified nitride part 230 satisfies a predetermined a* value or the b* value of the modified nitride part 230 satisfies a predetermined b* value. In another example, the optical detection system may determine whether the color of the modified nitride part 230 is within ~1 ΔE94 of the color of the metal substrate 202. If the optical detection system determines that the modified nitride part 230 has a color that does not satisfy any one of the predetermined L*, a* or b* values, then additional material (e.g., the nitrided titanium matrix) may be removed to satisfy any one of the predetermined L*, a* or b* values.

Alternatively, at step 610, if the optical detection system determines that the modified nitride part 230 has a color that satisfies any one of the predetermined L*, a* or b* values, then the external surface 232 of the modified nitride part 230 may be subjected to process, such as a polishing, texturizing or blasting process.

Figure 7:
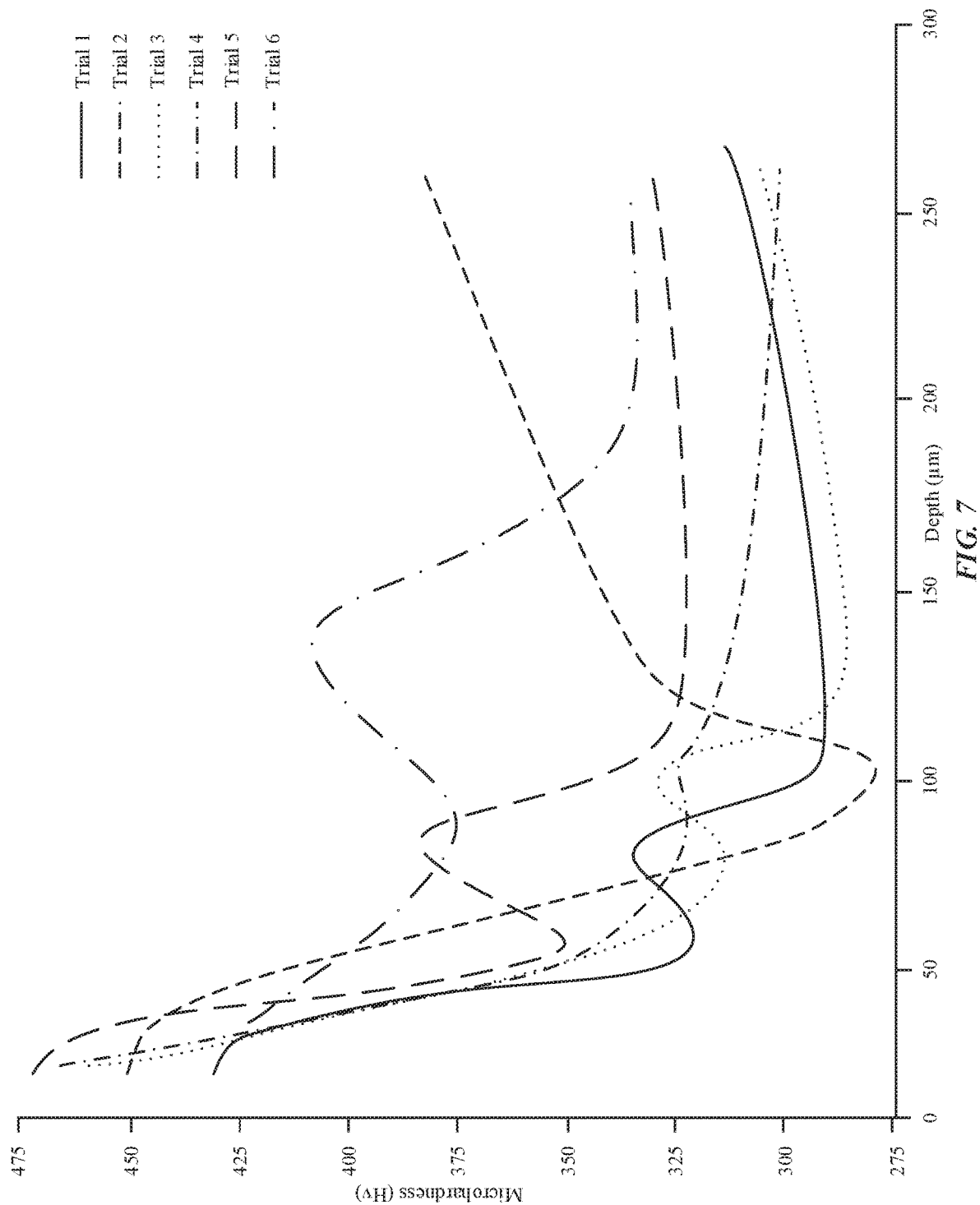
FIG. 7 illustrates an exemplary graph depicting hardness as a function of depth for exemplary nitrided titanium parts processed according to various techniques, in accordance with some embodiments.

FIG. 7 illustrates an exemplary hardness profile for various nitrided titanium substrates subsequent to a nitriding process, in accordance with various examples. In particular, the nitriding process results in a range of gold and brown colors for various nitrided titanium substrates—e.g., the nitrided titanium substrate 210. Furthermore, the microhardness rating for each of the nitrided titanium substrates varies according to the depth from an external surface. As illustrated in FIG. 7, six different nitrided titanium substrates were formed as a result of utilizing different nitriding parameters (e.g., partial pressure, temperature, and duration).

The nitrided titanium substrate processed under Trial 1 exhibited a light yellow, shallow hardness depth. Trial 1 includes subjecting the nitrided titanium substrate to a duration of 30 minutes and a partial pressure between 0.5-5.0 Torr.

The nitrided titanium substrate processed under Trial 2 exhibited a dark yellow, shallow hardness depth. Trial 2 includes subjecting the nitrided titanium substrate to a duration of 30 minutes and a partial pressure between 500-700 Torr.

The nitrided titanium substrate processed under Trial 3 exhibited a high hardness, deeper hardness depth. Trial 3 includes subjecting the nitrided titanium substrate to a duration of 120 minutes and a partial pressure between 0.5-5.0 Torr.

The nitrided titanium substrate processed under Trial 4 exhibited a deeper hardness depth. Trial 4 includes subjecting the nitrided titanium substrate to a duration of 120 minutes and a partial pressure between 500-700 Torr.

The nitrided titanium substrate processed under Trial 5 exhibited a deeper hardness depth than the sample processed under Trial 4. Trial 5 includes subjecting the nitrided titanium substrate to a duration of 120 minutes and a partial pressure between 500-700 Torr, but a temperature greater than the sample processed under Trial 4.

The nitrided titanium substrate processed under Trial 6 exhibited a deeper hardness depth than the samples processed under Trials 4 and 5. Trial 6 includes subjecting the nitrided titanium substrate to a duration of 120 minutes and a partial pressure between 500-700 Torr, but a temperature greater than the samples processed under Trials 4 and 5.

Accordingly, the hardness depth profile illustrated in FIG. 7 depicts that modifying any one of the partial pressure, temperature, and/or duration of the nitriding process can significantly alter the hardness depth profile and/or color profile for the nitrided titanium substrate 210. Thus, it may be necessary to control the nitriding parameters in order to form a nitrided titanium substrate having a shallow depth of color (i.e., gold/brown color does not exceed 1 µm depth) and a deep hardness depth (e.g., hardness of ~850 Hv at ~100 nm depth). Beneficially, controlling the nitriding parameters can reduce the amount of work required during the anodizing and/or chemical stripping processes to achieve a modified nitrided part 230 having a deep hardness and a natural titanium color.

Figure 8:
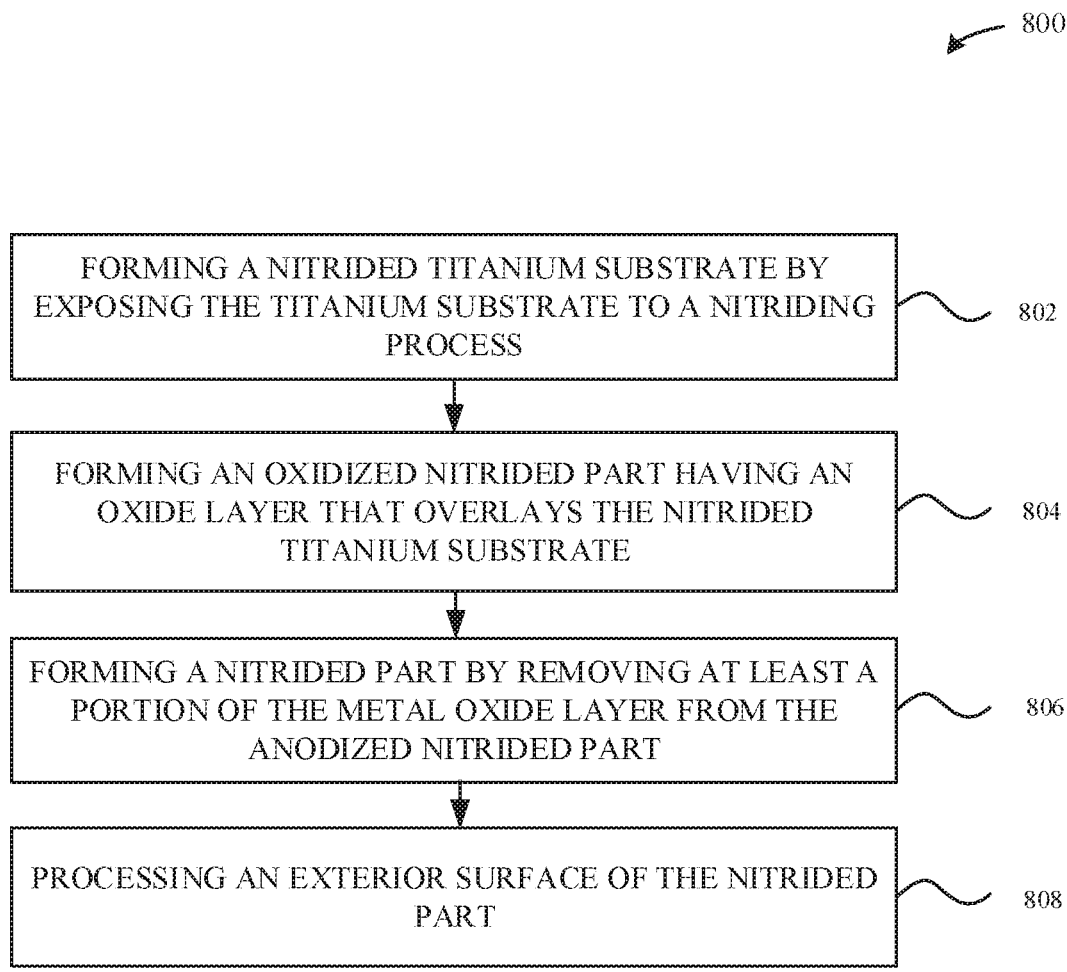
FIG. 8 illustrates a method for forming a nitrided titanium part, in accordance with some embodiments.

FIG. 8 illustrates a method 800 for forming nitrided titanium part, in accordance with some embodiments. In contrast to the method 600, the method 800 involves performing the nitriding, oxidizing, and stripping processes in a controlled atmosphere. The method 800 may be implemented in conjunction with a closed feedback loop that is implemented by an optical detection system and/or a controlled electrolytic anodization system.

The method 800 begins at step 802, which involves exposing the metal substrate 202 to a nitriding process (e.g., $N_2$ at an elevated temperature) to form the nitrided titanium substrate 210.

At step 804, while the nitrided titanium substrate 210 remains exposed to the elevated temperature, the $N_2$ is replaced with $O_2$ during a non-electrolytic oxidation process such as to form the oxidized nitrided substrate 220. The oxidized nitrided substrate 220 includes the metal oxide layer 222.

At step 806, at least a portion of the metal oxide layer 222 is removed from a remaining portion of the oxidized nitrided substrate 220 while the oxidized nitrided substrate 220 remains exposed to the elevated temperature in an argon-rich atmosphere. In particular, the metal oxide layer 222 can be dissolved by merely reducing the partial pressure of oxygen present. In other words, an etching solution (e.g., phosphoric acid) is not required to remove the metal oxide layer 222. The portion of the metal oxide layer 222 that is removed is based upon an amount necessary to revert the color of the modified nitride part 230 to a natural titanium color. In some examples, the portion may constitute a majority and/or an entirety of the metal oxide layer 222.

In some embodiments, an optical detection system may be utilized to monitor the color of the modified nitride part 230. In some embodiments, the optical detection system may determine whether the color of the modified nitride part 230 satisfies predetermined value and/or range. For example, the optical detection system may determine at least one of whether the L* value of the modified nitride part 230 satisfies a predetermined L* value, the a* value of the modified nitride part 230 satisfies a predetermined a* value or the b* value of the modified nitride part 230 satisfies a predetermined b* value. In another example, the optical detection system may determine whether the color of the modified nitride part 230 is within ~1 ΔE94 of the color of the metal substrate 202. If the optical detection system determines that the modified nitride part 230 has a color that does not satisfy any one of the predetermined L*, a* or b* values, then additional material (e.g., the nitrided titanium matrix) may be removed to satisfy any one of the predetermined L*, a* or b* values.

Alternatively, at step 808, if the optical detection system determines that the modified nitride part 230 has a color that satisfies any one of the predetermined L*, a* or b* values, then the external surface 232 of the modified nitride part 230 may be subjected to process, such as a polishing, texturizing or blasting process.

Any ranges cited herein are inclusive. The terms "substantially", "generally," and "about" used herein are used to describe and account for small fluctuations. For example, they can refer to less than or equal to ±5%, such as less than or equal to ±2%, such as less than or equal to ±1%, such as less than or equal to ±0.5%.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An enclosure for a portable electronic device, the enclosure comprising:
   a titanium substrate defining an external surface, the titanium substrate comprising at least 10 at % interstitial nitrogen atoms at or near the external surface, the titanium substrate having an a* value that is less than 1 and a b* value that is less than 5.

2. The enclosure of claim 1, wherein the titanium substrate has a surface hardness of 850 $HV_{0.1}$ or greater.

3. The enclosure of claim 1, wherein the titanium substrate has an L* value of 65 or more.

4. The enclosure of claim 1, wherein the color is characterized according to CIE L*a*b* color-opponent dimension values.

5. The enclosure of claim 1, wherein the titanium substrate has a surface hardness of 850 $HV_{0.1}$ or greater and a hardness of the titanium substrate decreases as a depth from the external surface increases.

6. The enclosure of claim 1, wherein the titanium substrate includes a chemically etched external surface.

7. The enclosure of claim 1, wherein the titanium substrate has a thickness of at least 10 μm or greater.

8. The enclosure of claim 7, further comprising:
a metal oxide layer that overlays the titanium substrate.

9. The enclosure of claim 8, wherein the metal oxide layer is modified to exhibit a range of colors relative to a thin film interference effect.

10. An enclosure for a portable electronic device, the enclosure comprising:
a titanium substrate; and
a titanium nitride layer overlaying the titanium substrate, the titanium nitride layer comprising at least 10 at % interstitial nitrogen atoms and having a thickness of less than 100 μm, the titanium nitride layer having an a* value less than 1 and a b* value less than 5.

11. The enclosure of claim 10, wherein the interstitial nitrogen atoms are uniformly dispersed throughout the titanium nitride layer.

12. The enclosure of claim 10, wherein the color is characterized according to CIE L*a*b* color-opponent dimension values.

13. The enclosure of claim 10, further comprising:
an anodized layer that overlays the titanium nitride layer.

14. The enclosure of claim 10, wherein the titanium nitride layer has an external surface that is blasted, textured or polished.

* * * * *